United States Patent
Baumgartner et al.

(10) Patent No.: US 8,418,093 B2
(45) Date of Patent: Apr. 9, 2013

(54) METHOD AND SYSTEM FOR DESIGN SIMPLIFICATION THROUGH IMPLICATION-BASED ANALYSIS

(75) Inventors: Jason R. Baumgartner, Austin, TX (US); Michael L. Case, Pflugerville, TX (US); Geert Janssen, Putnam Valley, NY (US); Robert L. Kanzelman, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 322 days.

(21) Appl. No.: 12/467,097

(22) Filed: May 15, 2009

(65) Prior Publication Data

US 2010/0293513 A1 Nov. 18, 2010

(51) Int. Cl.
*G06F 9/45* (2006.01)

(52) U.S. Cl.
USPC .............. 716/103; 716/106; 716/107

(58) Field of Classification Search ............ 716/103
See application file for complete search history.

(56) References Cited

U.S. PATENT DOCUMENTS 6,301,687 B1    10/2001  Jain
2006/0156261 A1* 7/2006  Farkash et al. ............ 716/5
2007/0136701 A1* 6/2007  Baumgartner et al. ...... 716/5
2008/0109776 A1  5/2008  Baumgartner
2008/0109781 A1  5/2008  Baumgartner

OTHER PUBLICATIONS

Kunz, Wolfgang; Stoffel, Dominik; Menon, Prem; "Logic Optimization and Equivalence Checking by Implication Analysis," Mar. 1997, IEEE.*

Wolfgang Kunz, "Logic Optimization and Equivalence Checking by Implication Analysis", Journal Article, 1997, Computer-Aided Design of Integrated Circuits and Systems, IEEE Transactions on vol. 16, Issue 3, Mar. 1997 pp. 266-281.

Vishnu C. Vimjam, "Strategies for SAT-based Formal Verification", PhD Dissertation, Jan. 20, 2007, Bradley Dept. of Electrical Engineering, Virginia Tech, Blacksburg, VA 24061.

* cited by examiner

*Primary Examiner* — Vuthe Siek
*Assistant Examiner* — Eric Lee
(74) *Attorney, Agent, or Firm* — Brevetto Law Group

(57) ABSTRACT

Methods and systems are provided for reducing an original circuit design into a simplified circuit design by merging gates that may not be equivalent but can be demonstrated to preserve target assertability with respect to the original circuitry design. A composite netlist is created from the simplified netlist and the original netlist. The composite netlist includes a number of targets that imply the existence of a target in the simplified netlist and a corresponding target in the original netlist. The implications are verified and then validated to ensure the simplified circuit design is a suitable replacement for the original circuit design.

21 Claims, 5 Drawing Sheets

METHOD AND SYSTEM FOR DESIGN SIMPLIFICATION THROUGH IMPLICATION-BASED ANALYSIS

CROSS-REFERENCE TO RELATED APPLICATIONS

The present application is assigned to the same assignee as, and incorporates by reference in their entirety, each of the following two U.S. patent documents: U.S. patent application Ser. No. 12/127,051 entitled "Incremental Speculative Merging;" and U.S. Pat. No. 7,260,799 entitled "Exploiting Suspected Redundancy for Enhanced Design Verification."

BACKGROUND

1. Field of the Invention

The present invention relates to digital circuitry designs, and more specifically systems and methods of reducing an original circuit design into a simplified circuit design.

2. Description of Related Art

Digital circuitry with memory elements may be modeled using state equations and state variables to describe the behavior and state of the system. The synthesis and verification of state variable models often requires a great deal of computational resources. Simplifying the model to reduce the number of state variables, or simplifying the logic that defines state transitions, lessens the computational cost of analyzing the model, for example, to verify that it conforms to a given specification. The ability to reduce design size may make the difference in whether or not it is feasible to use a verification algorithm to expose a design flaw.

Formal and semi-formal verification techniques are powerful tools for the construction of correct logic designs. They have the power to expose even the most probabilistically uncommon scenario that may result in a functional design failure, and ultimately have the power to prove that the design is correct by showing that no failing scenario exists. Unfortunately, formal verification techniques require computational resources which are exponential with respect to the size of the design under test. Semi-formal verification techniques allow formal algorithms to be applied to larger designs through resource-bounding, though at the expense of incomplete verification coverage.

One conventional approach to improve the merging of gate was described in a paper by Qi Zhu et al. entitled "SAT Sweeping with Local Observability Don't-Cares," published for the 2006 Design Automation Conference (pps. 229-234). This paper discusses the use of "observability don't cares" (ODCs) to enhance merging. ODC-enhanced merging generalizes upon traditional merging by enabling the merging of two gates which are demonstrated at any point in time to either be equivalent, or to differ without altering the design behavior with respect to some fanout boundary.

What is needed is an improved way of reducing a complex digital circuitry design to a more manageable size for synthesis and verification.

SUMMARY

Embodiments disclosed herein address the above stated needs by providing systems and methods for reducing a digital circuitry design to build a simplified circuit that preserves assertability. In various embodiments a simplified netlist is built from an original netlist of the digital circuitry design; a composite netlist is built from the simplified netlist and the original netlist, the composite netlist including failure targets which are each associated with respective implications. Each of the implications is checked to ensure that for an associated simplified netlist target there is a corresponding original netlist target. The simplified netlist is verified by determining whether each of the failure targets is assertable or is unassertable, and any unassertable failure targets are reported as validated in response to the verifying the simplified netlist. It is determined whether there are any assertable failure targets, and if there are, an attempt is made to validate them by considering a failure scenario in the simplified netlist and checking for a corresponding failure scenario in the original netlist. Then any assertable failure targets having a failure scenario in the simplified netlist and a corresponding failure scenario in the original netlist are reported as being validated.

BRIEF DESCRIPTION OF THE DRAWINGS

The accompanying drawings, which are incorporated in and constitute part of the specification, illustrate various embodiments of the invention. Together with the general description, the drawings serve to explain the principles of the invention. In the drawings.

DETAILED DESCRIPTION

Figure 1:
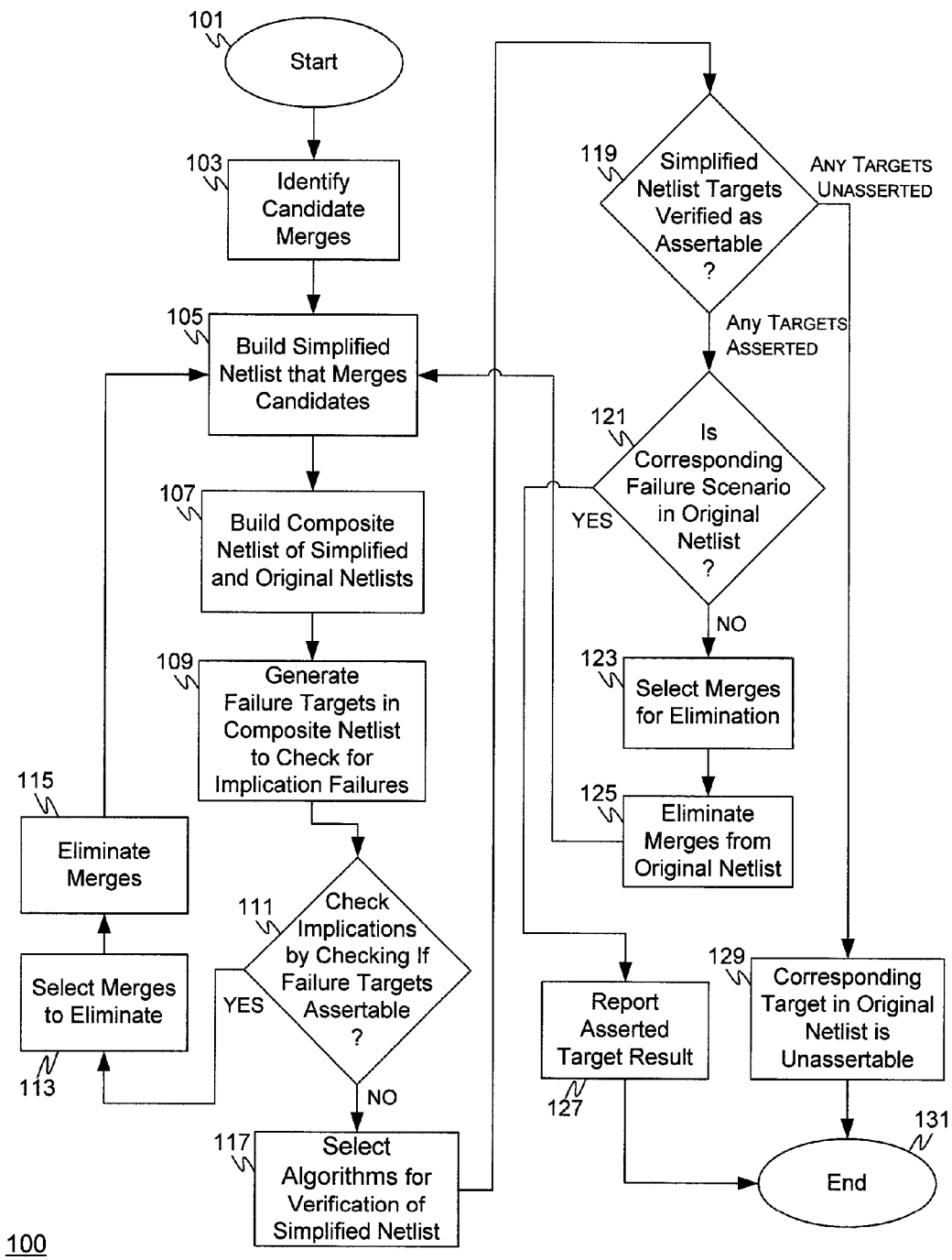
FIG. 1 is a flowchart for a method of using implication-based analysis to simplify a digital circuitry design according to various embodiments of the invention.

Various embodiments of the present application involve improved automated methods for reducing the size of a design under verification. The embodiments merge gates in a design if doing so can be shown to conservatively preserve property checking, and be proven to be equivalent. In particular, various embodiments efficiently demonstrate that merging a gate in a specific way preserves "target implications." As such, any computation which will assert a target (representing a failure of the property) on the original design will still assert the target after the merge. However, it should be noted that the converse may not be true: a computation which results in a target assertion after the merge may not result in one prior to the merge. We thus couple the conservative reduction with a framework to eliminate merges which are determined to cause a spurious target assertion. This reduction is useful to simplify subsequent formal and semi-formal analysis both to enable computationally intractable proofs and bug identification.

Formal verification techniques can often be improved exponentially in run-time through reductions in the size of a netlist. Various embodiments of the present invention present a novel method for reducing netlist size through merging a set of gates, by demonstrating that doing so conservatively preserves target assertability. This work generalizes upon conventional approaches towards ODC-based merging such as the paper discussed above by Qi Zhu entitled "SAT Sweeping with Local Observability Don't-Cares." The various embodiments disclosed herein provide a more generalized approach by enabling merges that preserve implications with respect to the target gates of a design, versus conventional systems that require preserving strict equivalence. The benefits of this approach are two-fold. First, even for merges which preserve equivalence with respect to the target gates, the proof of implication may be dramatically computationally simpler than the proof of equivalence. Second, because implication is a more general relation than equivalence (e.g., all gates which are equal preserve implication, though certain gates which preserve implication may not be equivalent), our approach enables a greater degree of merging than any conventional framework.

Netlists are often used to represent circuitry designs. One preliminary activity in practicing the various embodiments is to define the netlists to be used, and to define any introductory terms or conditions. Typically, a circuit design netlist contains a directed graph with vertices representing gates, and edges representing interconnections between those gates. The gates have associated functions such as constants, primary inputs, combinational logic such as AND gates, and sequential elements (state devices) sometimes referred to as registers. Registers have two types of associated functions: their next-state functions, and their initial-value functions. Both may be represented as gates in the netlist graph. Semantically, for a given register, the value appearing at its initial-value gate at time "0" ("initialization" or "reset" time) will be applied as the value of the register itself. The value appearing at its next-state function gate at time 'i' will be applied to the register itself at time 'i+1'. A netlist with no registers represents combinational logic. Certain gates in a netlist may be labeled as "targets." Targets correlate to the properties sought to be verified. One goal of the verification process is to find a way to drive a "1" to a target node—and to generate a "trace" of valuations to gates over time illustrating this scenario if one is found—or else to prove that no such assertion of the target is possible. "Constraints" are used to artificially limit the stimulus that can be applied to the inputs of the design. In particular, when searching for a way to drive a "1" to a target, the verification process typically adheres to the rule that every constraint gate must evaluate to a logical 1 for every time-step up to, and including, the time-step at which the target is asserted. The term "cofactor" refers to replacing an input in a design by a constant. A positive cofactor refers to replacing the input by constant 1. A negative cofactor refers to replacing the input by constant 0. A netlist may be simplified by the "merge" operation which replaces fanout references from one gate with references to the gate that it is being merged onto. A "cut" refers to a partitioning of a netlist graph into two components. An "equivalence" over two gates refers to the condition that they always evaluate to the same value across all computations of the netlist. An "implication" over two gates g1 and g2 ("g1 implies g2") is true as long as no computation of the netlist will result in g1 evaluating to 1 with g2 evaluating to 0.

FIG. 1 is a flowchart 100 for a method of using implication-based analysis to simplify a digital circuitry design according to various embodiments of the invention. The method begins at 101 and proceeds to 103 to identity candidate merges. This may be done using an arbitrary mechanism to compute a set of candidate merges in the original netlist. For example, one way of doing this is by using "observability" computations, by first simulating the design for a certain number of vectors, then computing "controlling" paths backward from the points being equivalence checked—or in accordance with the various embodiments herein, from the points being implication-checked. Doing this helps to enumerate scenarios under which a specific merge cannot be visible because the value of the gate being merged cannot propagate. Observability "masks" can be computed for all gates, and candidate merges can be enumerated as those gates which evaluate identically when their value is not masked. However, other techniques can be used, such as initially guessing that all gates are equivalent and requiring a series of loops through block 105 to iteratively eliminate those merges which are not safe to perform. It is often the case that the gates that are viable candidates for merges represent only a small fraction of all the gates in the design.

Returning to block 103, once a set of candidate merges has been identified the method proceeds to 105 to build a simplified netlist that merges the candidates identified in block 103. Typically, the activities of block 105 entail performing those merges suspected to be adequate for verification. The method then proceeds to 107 to build a composite netlist which includes the original netlist as well as the simplified netlist constructed in block 105. To build the composite netlist corresponding gates across the original and the simplified models are merged. Upon completing the composite netlist the method proceeds to 109 to generate new targets to check the composite netlist.

In block 109, first the targets from the original and simplified model are un-labeled as targets. Then new targets are added. The new targets may be called failure targets. Each failure target checks that what was previously a target in the simplified netlist implies the corresponding target in the original design. (This is the implication in the implication-based analysis.) The failure targets ensure that the verification results will be conservatively preserved. An assertion of a failure target indicates a failure of the implication associated with that target. On the other hand, if a failure target is proven unassertable, then that part of the composite netlist is verified for the corresponding target of the simplified network. A failure target proven unassertable for the simplified design is valid to imply an unassertable target on the original design. Such proofs are generally more efficient to generate on the simplified design versus original design since it is smaller. However, the converse of an implication does not always hold true. A failure encountered on the simplified design may be invalid on the original design, hence the need for blocks 121-127 to validate those failures. Note that certain types of merges performed to obtain the simplified model are guaranteed to preserve the validity of failure scenarios. For example, if a RANDOM gate is merged, the resulting failure scenario is always valid on the original netlist since RANDOM gates are free to drive the values obtained from the failing scenario on the simplified netlist. Returning to block 109, once the new failure targets have been generated the method proceeds to 111.

Block 111 determines whether or not the failure targets are unassertable. In various embodiments this may be done by leveraging an arbitrary set of algorithms to prove that the implication condition holds, i.e., that the targets resulting from the composite netlist of block 107 are unassertable. If it is determined in block 111 that a failure target is assertable the method proceeds from 111 along the YES branch to 113 to select one or more merges to be eliminated. The method selects those merges determined to be responsible for the unsuccessful proof. Note that any time that merges are eliminated (e.g., blocks 113/115 and 123/125) it is possible to attempt alternate merges in their place. For example, instead of attempting to merge gate g1 onto g2, we may attempt to merge gate g1 onto g3. This enables a fixed-point process yielding the maximum number of merges that are safe to perform. Note also that care must be taken when introducing alternate merges in the place of prior ones so that the process ultimately does converge, versus changing merge g1 onto g2 at one phase into g1 onto g3 on the next phase then again g1 onto g2 in the following phase. Such convergence may be simply be guaranteed by recording the set of attempted merges at any iteration (construction of the simplified model in block 105), and ensuring that the process does not repeat the same set at a future iteration. Returning to block 113, upon selecting one or more merges the method proceeds to 115 to eliminate them. The method then loops back to 105 to again build a simplified netlist that merges the remaining candidate merges.

Returning to block 111, if it is determined that the new targets are unassertable the method proceeds from 111 along the NO branch to 117 for verification of the composite netlist. Block 117 selects an arbitrary set of algorithms for verification of the simplified netlist built in block 105. The method then proceeds to 119 to determine whether the simplified netlist is verified, that is, whether the failure targets are asserted or unasserted. In block 119, for targets that are asserted then the method proceeds from 119 along the ASSERTED path to 121 to then determine whether the corresponding failure scenario for the asserted targets is included in the original netlist. If the failure scenario is also in the original netlist the method proceeds from 121 along the YES branch to 127. In 127 the result of the failure scenario is reported, and then the method proceeds to 131 and ends. However, if it is determined in 121 that the corresponding failure scenario is not in the original netlist the method proceeds from 121 along the NO path to select one or more merges for elimination in block 123. The merges to be selected for elimination are merges that are responsible for the spurious failure. The method then eliminates the selected merges in 125 and loops back to 105 to again build a simplified netlist.

Returning to block 119, if it is determined that one or more of the failure targets are unassertable the method proceeds from 119 along the UNASSERTABLE path to 129. In block 129 the one or more unassertable failure targets are reported. If all targets have been checked the data for the simplified netlist is saved. This may entail saving the simplified netlist in a form suitable for use in modifying the digital circuit to reduce its complexity. The method then proceeds from 129 to 131 and ends. The method 100 depicted in FIG. 1 may be characterized by the following high-level pseudocode for using implication-based analysis to simplify a digital circuitry design:

Procedure for Implication-Based Analysis:
1. Use an arbitrary mechanism to compute a set of candidate merges in the original netlist.
2. Build a simplified netlist which merges the candidates identified in step (1).
3. Build a composite netlist which includes the original netlist, as well as the simplified netlist from step 2. Corresponding RANDOM gates (across the original and simplified model) are merged in the composite model. Any targets from the original and simplified model are unlabeled as targets, though we add a new target checking that what was previously a target in the simplified netlist implies the corresponding target in the original design.
4. Leverage an arbitrary set of algorithms to prove that the implication condition holds—that the targets resulting from step 3 are unassertable.
5. If step 4 is successful, continue to step 7.
6. If step 4 is not successful, eliminate some merges that are responsible for the unsuccessful proof and repeat step 2.
7. Perform verification using an arbitrary set of algorithms on the simplified netlist from step 2.
8. If any targets are proven unassertable in step 7, report to the user that the corresponding targets of the original netlist are unassertable.
9. If any target is asserted, check whether the corresponding failure scenario on the simplified netlist also represents a failure scenario in the original netlist.
10. If the failure scenario from step 9 is valid on the original netlist, report this result to the user.
11. if the failure scenario from step 9 is invalid on the original netlist, eliminate some merges that are responsible for the spurious failure and repeat step 2.

Figure 2:
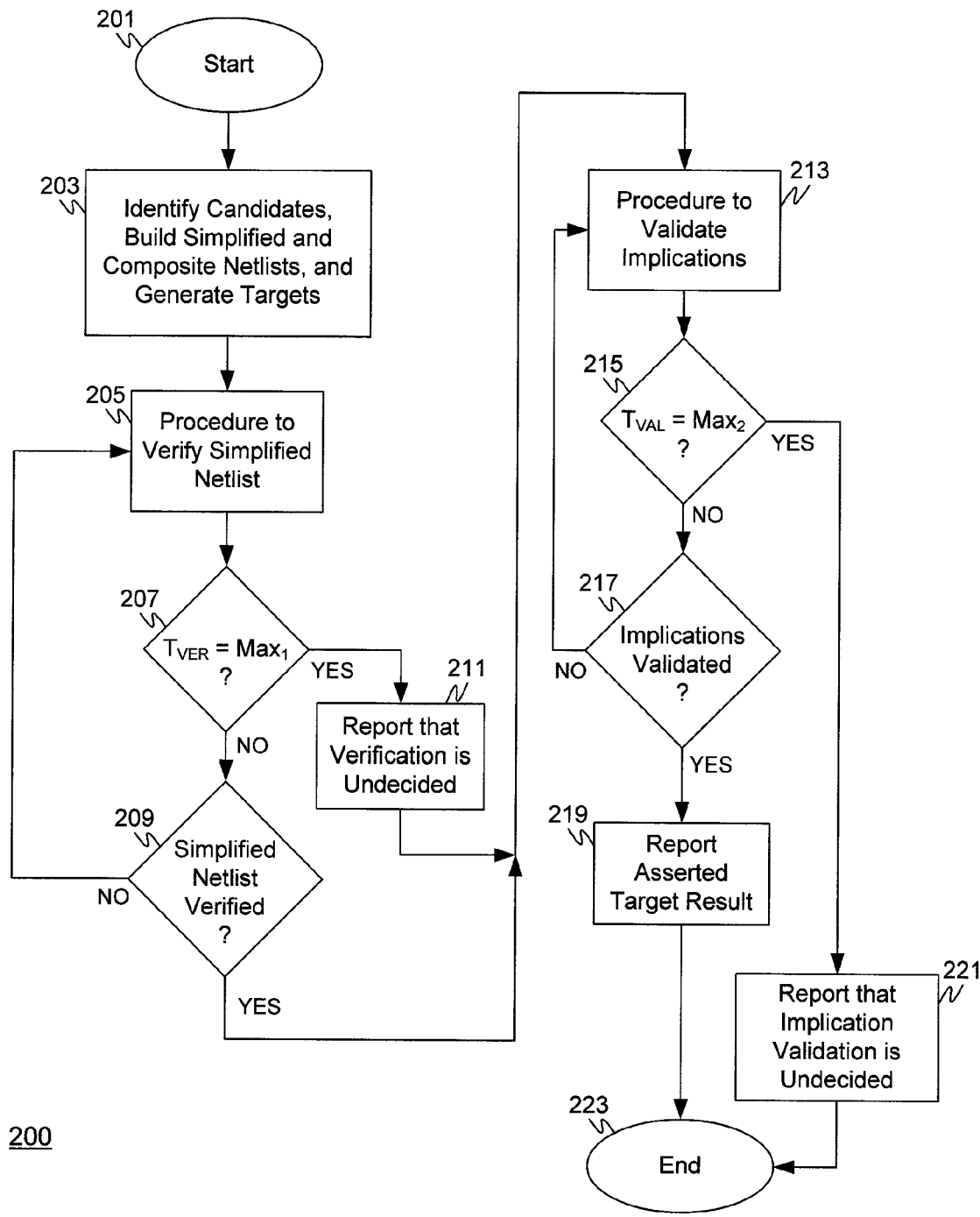
FIG. 2 is a flowchart for an overview of the method of using implication-based analysis with time constraints introduced.

FIG. 2 is a flowchart 200 for an overview of the method of using implication-based analysis with time constraints introduced, according to various embodiments of the invention. It should be noted that certain merges which preserve target implication may result in an invalid assertion of a target gate in the simplified netlist. For example, if we merge the target gate to a value of constant "1" the merge can easily be proven to preserve target implication (e.g., see 111-115 of FIG. 1), though the simplified netlist may be prone to blatant spurious failures that will not be valid on the original netlist (e.g., see 121-125 of FIG. 1). In some situations, one or the other of blocks 113-115 or blocks 123-125 may be more adept at eliminating merges. Consequently, it is sometimes desirable to apportion the resources between the two techniques for eliminating merges. The embodiment depicted in FIG. 2 imposes time-slice analysis between these two procedures. This is done by imposing time constraints $T_{VER}$ and $T_{VAL}$ to respectively impose time constraints on the verification of the simplified netlist and the validation of its constraints. $T_{VER}$ may be set to a predetermined time limit $Max_1$, thus limiting the computing resources used for verification of the simplified netlist. Similarly, $T_{VAL}$ may be set to a predetermined time limit $Max_2$. The limits $Max_1$ and $Max_2$ may be specified in terms of time, digital circuit clock periods, numbers of calculations, measurements of memory usage, or any other such units used to measure computational resources. In some instances it may be advantageous to reverse the order of steps performed in verification of the simplified netlist and validation of the composite netlist. More generally, one may time-slice computational effort between these two procedures for overall efficiency, in the manner described in conjunction with FIGS. 2-4.

Returning to FIG. 2, the method begins at 201 and proceeds to 203 to identify candidates merges, build a simplified netlist which merges the candidates, build a composite netlist, and generate targets for checking the composite netlist. These may be performed the same as the activities described above in conjunction with blocks 103-109 of FIG. 1. Upon completing these activities the method proceeds to 205 to conduct procedures for verifying equivalence of the simplified netlist (e.g., as was done in FIG. 1). Upon completing block 205 the method proceeds to 207. Block 207 is where the time constraint is imposed for resources being expended in verifying the simplified netlist. In 207 it is determined whether the $T_{VER}=Max_1$ limit has been reached for the amount of resources to be devoted to verifying the simplified netlist. If it is determined that $T_{VER}=Max_1$ has been reached (or $T_{VER} \geq Max_1$) the method proceeds from 207 along the YES branch to 211 to report that the simplified netlist verification was not decided (and instead, the time maximum for $T_{VER}$ was reached). The method then proceeds to 213 to begin attempting to validate the implications. Returning to block 207, if it is determined that the $T_{VER}=Max_1$ limit has not yet been reached the method then proceeds from 207 along the NO path to 209 to determine whether the simplified netlist is verified. This may be done in the manner of blocks 111-115 by determining whether any failure targets are assertable, and if so, eliminating some of the merges. Similar to FIG. 1, if the simplified netlist is not yet verified the method proceeds from 209 along the NO branch, looping back around to 205.

If it is determined in 209 that the simplified netlist has been verified the method proceeds from 209 along the YES branch to 213 to begin attempting to validate the implications. Part of the embodiment depicted in FIG. 2 involves limiting the amount of resources spent attempting to validate implications, as was done for verifying the simplified netlist above. Block 213 performs procedures attempting to validate the implications, for example, as was done in blocks 117-125 of FIG. 1. Upon completing 213 the method proceeds to 215. Block 215 determines whether the $T_{VAL}=Max_2$ limit has been reached (or $T_{VAL} \geq Max_2$), indicating a limit to the amount of resources to be expended in attempts to validate the implications. If $T_{VAL}$ is equal to or greater than $Max_2$ (i.e., the allotted resources have been spent) the method proceeds from 215 along the YES path to 221 to report that the status as being undecided as to whether the implications are validated. However, if it is determined in 215 that $T_{VAL}$ is still less than $Max_2$ then the method proceeds from 215 along the NO path to 217 to determine the outcome of implication validation in block 213. If it is determined in 217 that the implications have not been validated the method proceeds from 217 along the NO path, looping back to the implication validation procedures in block 213. However, if it is determined in block 217 that the implications are validated the method proceeds from 217 along the YES path to 219 to report the results. The results may be reported by saving them in a form suitable for implementing or otherwise understanding the improvements discovered for the digital circuitry design. Upon completing 219 the method proceeds to 223 and ends.

The method 200 depicted in FIG. 2 may be characterized by the following high-level pseudocode for using implication-based analysis with time constraints to simplify a digital circuitry design:

Procedure for Implication-Based Analysis with Time Constraints:
  1a. Use an arbitrary mechanism to compute a set of candidate merges in the original netlist.
  2a. Build a simplified netlist that merges the candidates identified in step 1a.
  3a. Build a composite netlist which includes the original netlist, as well as the simplified netlist from step 2a. Corresponding random gates (across the original and simplified model) are merged in the composite model. Pay targets from the original and simplified model are unlabeled as targets, though we add a new target checking that what was previously a target in the simplified netlist implies the corresponding target in the original design.
  4a. Initialize: verified=false, safe_merge=false.
  5a. loop forever:
  6a. if (verified !=true): spend a specified amount of computational effort in Verify_Simplified_Netlistfl, recording its return code in variable verified. If (verified false): go to step 2a.
  7a. if (safe_merge !=true): spend a specified amount of computational effort in Validate_Implications( ), recording its return code in variable safe_merge. If (safe_merge==false||safe_merge==undecided): go to step 2a.
  8a. if (safe_merge==true AND verified==true): report targets corresponding to the targets proven unassertable by Verify_Simplified_Netlist( ) to the user, exit loop.

Figure 3:
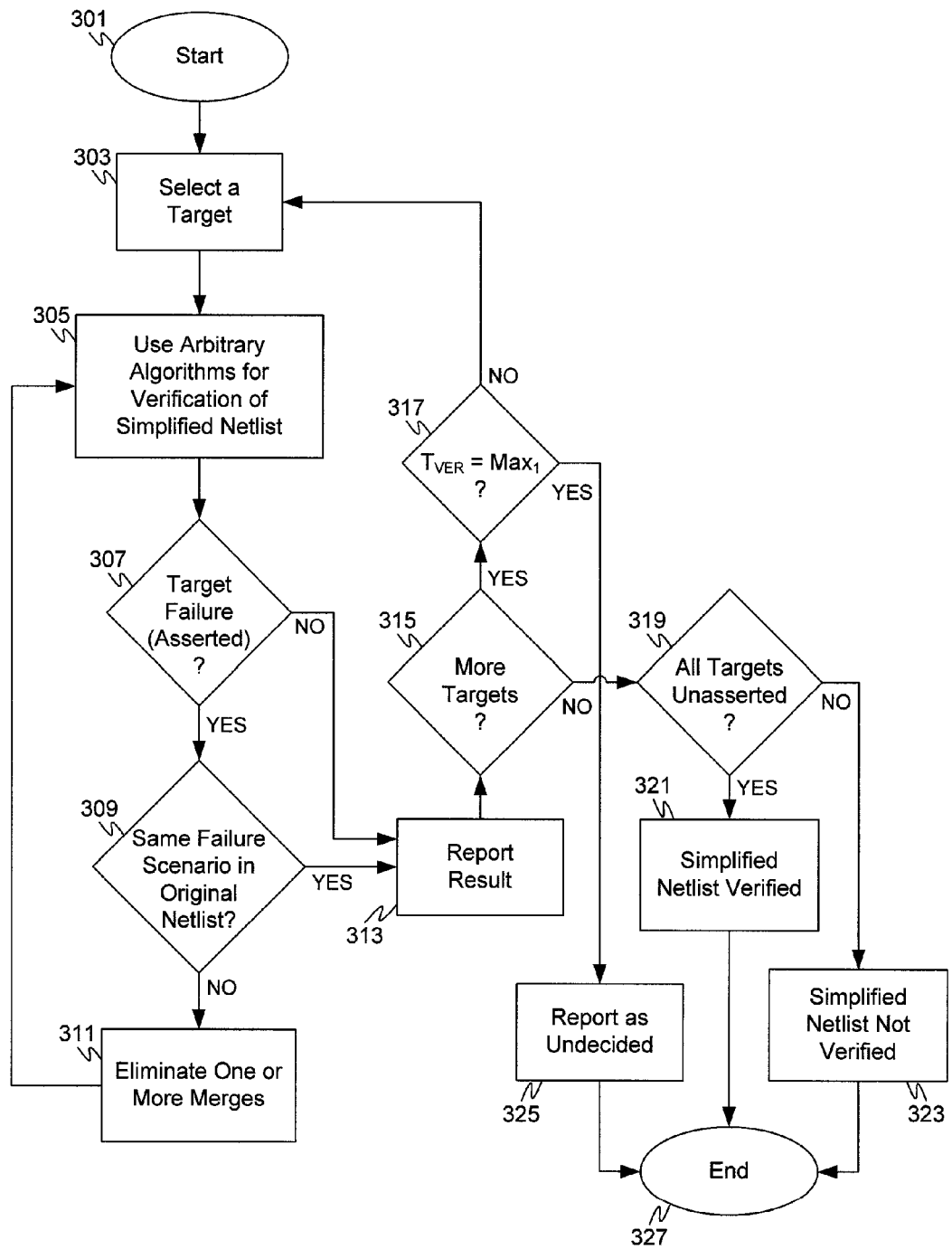
FIG. 3 is a flowchart with details for a method of verifying the simplified netlist.

FIG. 3 is a flowchart 300 with further details for a method of verifying the simplified netlist with time constraints introduced, according to various embodiments of the invention. The method begins at 301 and proceeds to 303 to select a target. In 305 an arbitrary algorithm is used in an attempt to verify the simplified netlist. The method then proceeds to 307 to determine whether or not the target failed (was asserted). If it is determined in 307 that the target failed the method proceeds from 307 along the YES branch to 309. In block 309, if it is determined that the same failure scenario exists in the original netlist the method proceeds from 309 along the YES branch to 313 to report the result. Otherwise, if the failure scenario does not exist in the original netlist the method proceeds from 309 along the NO branch to 311 to determine whether there are any merges likely to have caused the failure that can be removed. Upon eliminating one or more merges in block 311 the method loops back to 305 to again use an arbitrary algorithm in an attempt to verify the simplified netlist.

In block 313 (from either 309 or 307) the system reports the result of the simplified netlist verification, and then proceeds to 315 to determine whether there are more targets to verify. If there are further targets the method proceeds from 315 along the YES branch to 317 to see whether the maximum time limit has been reached for performing the simplified netlist verification. Once the time variable (or other resource measurement variable) $T_{VER}$ reaches the predetermined limit for resources to expend, $Max_1$, the method proceeds from 317 along the YES branch to 325 to report the simplified netlist verification as undecided. Upon completing 325 the method proceeds to 327 and ends. However, if it is determined in block 317, that $T_{VER}$ has not yet reached $Max_1$ then the method loops back to 303 to select another target and begin the verification procedure again.

Returning to block 315, if it is determined that there are no further targets to attempt to verify the method proceeds from 315 along the NO branch to 319 to ascertain whether or not the simplified netlist has been successfully verified. If it is determined in block 319 that not all of the targets are unasserted the method proceeds along the NO branch to 323, and the system reports that the simplified netlist is not verified. However, if block 319 determines that all of the targets are unasserted, then the method proceeds along the YES branch to 325 to report that the simplified netlist as being verified. The method then proceeds to 327 and ends.

The method 300 depicted in FIG. 3 may be characterized by the following high-level pseudocode for verifying the simplified netlist with time constraints to simplify a digital circuitry design:

Procedure Verify_Simplified_Metlist (Simplified Netlist):
  1b. Perform verification using an arbitrary set of algorithms on the simplified netlist.
  2b. If any target is asserted, check whether the failure scenario on the simplified netlist also represents a failure scenario in the original netlist.
  3b. If the failure scenario from step 2b is valid on the original netlist, report this result to the user.
  4b. If the failure scenario from step 2b is invalid on the original netlist, eliminate some merges that are responsible for the spurious failure, return "false".
  5b. If all targets are proven unassertable in step 1b, return "true".
  6b. If a resource limit expires on this procedure before all targets are solved, return "undecided".

Figure 4:
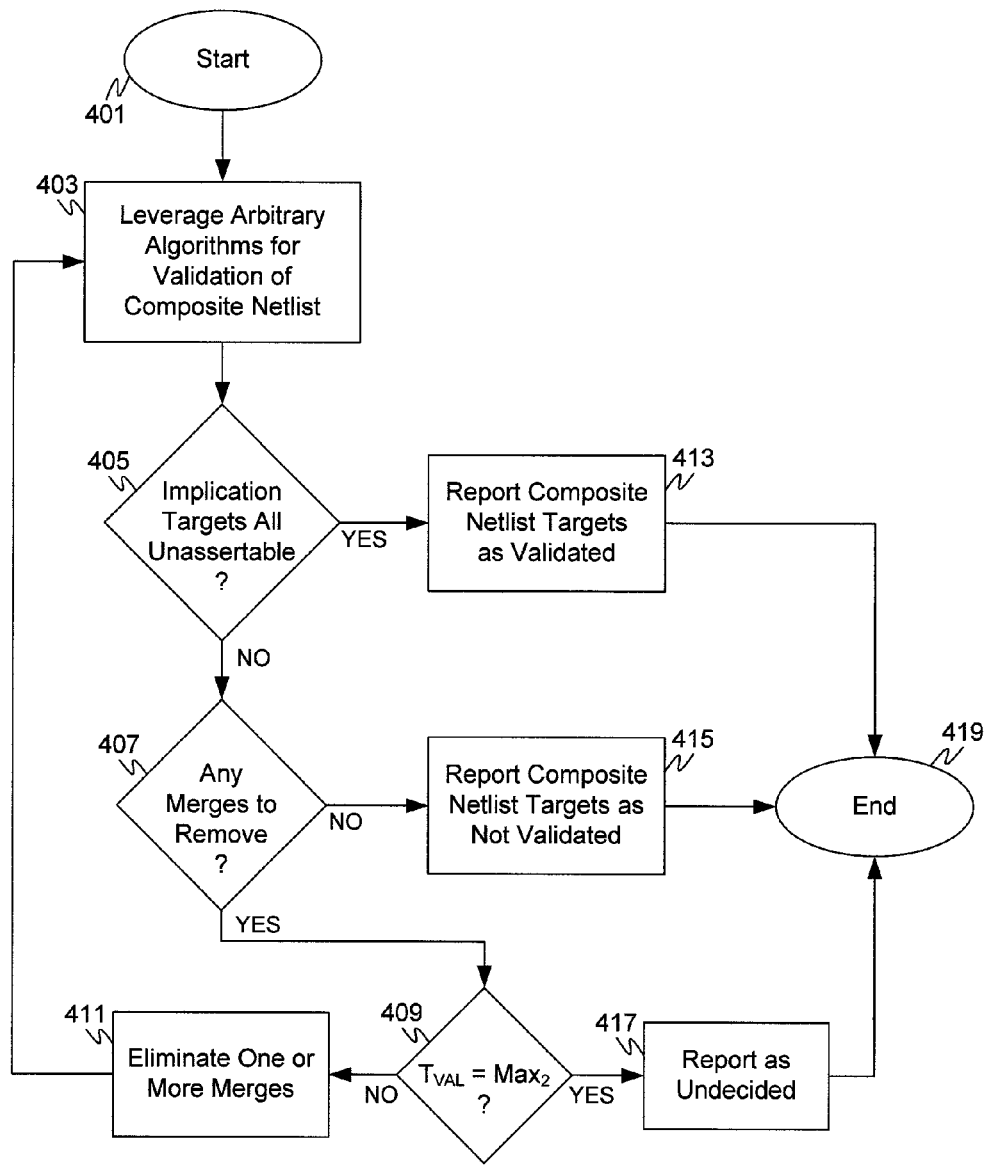
FIG. 4 is a flowchart with details for a method of validating the composite netlist.

FIG. 4 is a flowchart 400 with details for a method of validating the composite netlist according to various embodiments. The method begins at 401 and proceeds to 403. In block 403 arbitrary algorithms are leveraged in an attempt to validate the composite netlist. Upon completing 403 the method proceeds to 405 to determine whether the composite netlist was successfully validated by detecting whether all implication targets are unassertable. If it is determined in 405 that the implication targets are not all unassertable, then the method proceeds from 405 along the NO path to 407 to take further steps in an attempt to validate the composite netlist. Block 407 determines whether any of the composite netlist merges can be removed. If there are no merges that can be removed the method proceeds from 407 along the NO branch to 415 to report the validation failure. In block 415 the system reports that the composite netlist targets are not validated. The method then proceeds to 419 and ends. However, if it is determined in 407 that there is at least one merge that can be removed the method proceeds from 407 along the YES branch to 409.

Block 409 determines whether the $T_{VAL}$=Max$_2$ limit has been reached, indicating that the limit has been reached for the amount of resources to be expended in attempts to validate the composite netlist. If $T_{VAL}$ is equal to or greater than Max$_2$ indicating that the resource limit has been reached, then the method proceeds from 407 along the YES path to 417 to report that the status is being undecided as to whether the validation of the composite netlist. However, if $T_{VAL}$ is determined to be less than Max$_2$ in 409, then the method proceeds from 409 along the NO branch to 41. In 411 one or more merges of the composite netlist are eliminated. The method then loops back to 403 to again attempt to validate the composite netlist. Returning to block 405, if it is determined in 405 that the implication targets are all unassertable the method proceeds from 405 along the YES path to 413. In bock 413 the system reports the composite netlist targets as validated, and then the method proceeds to 419 and ends.

The amount of computational effort applied in attempting each of the procedures described above in conjunction with FIG. 3 and FIG. 4 (i.e., the Verify_Simplified_Netlist( ) procedure and the Validate_Implications( ) procedure) can be arbitrarily decided based on the user's experiences and preferences. In some embodiments the computation resource limits may initially begin as relatively small amounts, and then be increased for each subsequent iteration, so as to avoid consuming excessive resources in early applications of either procedure.

The method 400 depicted in FIG. 4 may be characterized by the following high-level pseudocode for validating the composite netlist with time constraints to simplify a digital circuitry design:

Procedure Validate_Implications (Composite Netlist):
1c. Leverage an arbitrary set of algorithms to prove that the implication condition (reflected in the targets within the composite netlist) holds.
2c. If all implication targets are proven unassertable in step 1c. return "true".
3c. If any implication target is asserted in step 1c, eliminate some merges that are responsible for the assertion, return "false".
4c. If a resource limit expires on this procedure before all targets are solved, eliminate some merges that may be responsible for the large resources, return "undecided".

Figure 5:
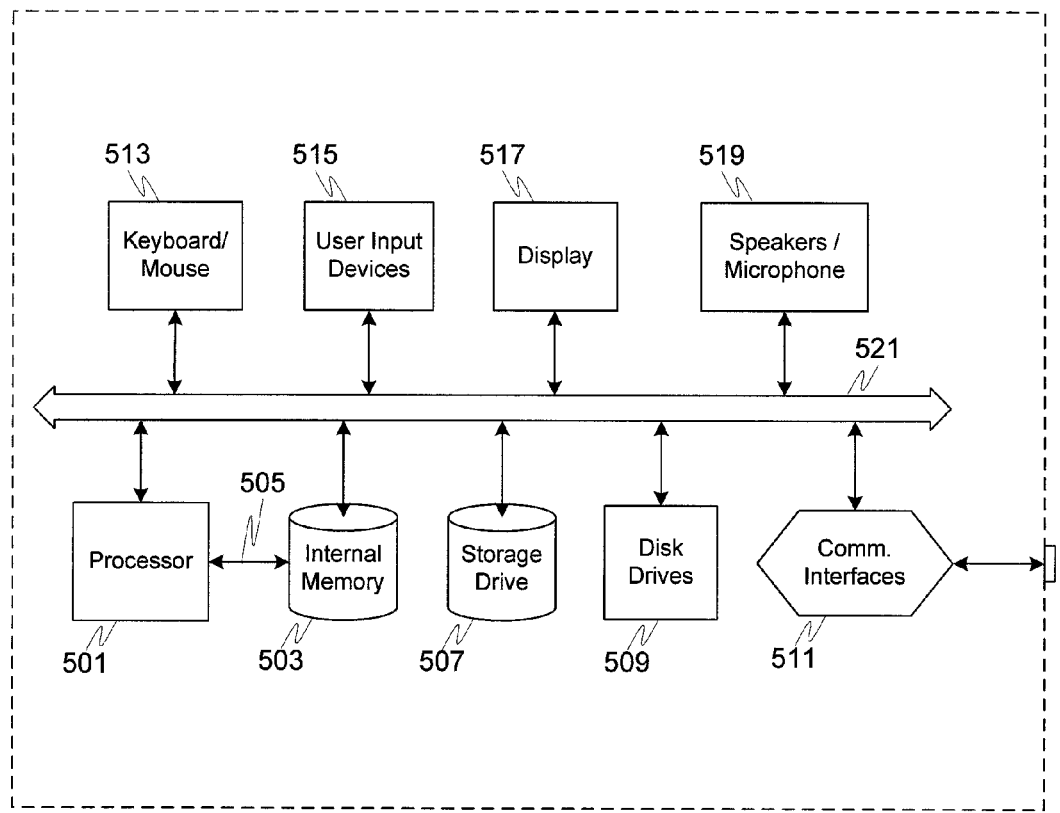
FIG. 5 depicts an example of a computer system 500 suitable for implementing and practicing various embodiments.

FIG. 5 depicts an example of a computer system 500 suitable for implementing and practicing various embodiments. The computer system 500 may be configured in the form of a desktop computer, a laptop computer, a mainframe computer, or any other arrangements capable of being programmed or configured to carry out instructions. The computer system 500 may be located and interconnected in one location, or may be distributed in various locations and interconnected via a local or wide area network (LAN or WAN), via the Internet, via the public switched telephone network (PSTN), or other such communication links. Other devices may also be suitable for implementing or practicing the embodiments, or a portion of the embodiments.

Typically, a computer system 500 includes a processor 501 which may be embodied as a microprocessor or central processing unit (CPU). The processor 501 is typically configured to access an internal memory 503 via a bus such as the system bus 521. The internal memory 503 may include one or more of random access memory (RAM), read-only memory (ROM), cache memory, or a combination of these or other like types of circuitry configured to store information in a retrievable format. In some implementations the internal memory 503 may be configured as part of the processor 501, or alternatively, may be configured separate from it but within the same packaging. The processor 511 may be able to access internal memory 503 via a different bus or control lines (e.g., local bus 505) than is used to access the other components of computer system 500.

The computer system 500 also typically includes, or has access to, one or more storage drives 507 (or other types of storage memory) and floppy disk drives 509. Storage drives 507 and the floppy disks for floppy disk drives 509 are examples of machine readable mediums suitable for storing the final or interim results of the various embodiments. The storage drive 507 is often a hard disk drive configured for the storage and retrieval of data, computer programs or other information. The storage drive 507 need not necessarily be contained within the computer system 500. For example, in some embodiments the storage drive 507 may be server storage space within a network or the Internet that is accessible to the computer system 500 for the storage and retrieval of data, computer programs or other information. For example, the computer system 500 may use storage space at a server storage farm accessible by the Internet 550 or other communications lines. The floppy disk drives 509 may include a combination of several disc drives of various formats that can read and/or write to removable storage media (e.g., CD-R, CD-RW, DVD, DVD-R, floppy disk, etc.). The computer system 500 may either include the storage drives 507 and floppy disk drives 509 as part of its architecture (e.g., within the same cabinet or enclosure and/or using the same power supply), as connected peripherals, or may access the storage drives 507 and floppy disk drives 509 over a network, or a combination of these. The storage drive 507 is often used to store the software, instructions and programs executed by the computer system 500, including for example, all or parts of the computer application program for caring out the various embodiments. The storage drive 507 may be configured to have several portions (e.g., directories within the memory) that contain various software, instructions and programs for carrying out the various embodiments and for storing the results or other data. For example, the storage drive 507 may have a first memory portion, a second memory portion, a third memory portion, and so on, for use in storing computer programs and data.

The computer system 500 may include communication interfaces 511 configured to be communicatively connected to the Internet, a local area network (LAN), a wide area network (WAN), or connect with other devices using protocols such as the Universal Serial Bus (USB), the High Performance Serial Bus IEEE-1394 and/or the high speed serial port (RS-232). The computers system 500 may be connected to the Internet via the wireless router 501 (or a wired router or other node—not shown) rather than have a direct connected to the Internet. The components of computer system 500 may be interconnected by a bus 521 and/or may include expansion slots conforming to any of various industry standards such as PCI (Peripheral Component Interconnect), ISA (Industry Standard Architecture), or EISA (enhanced ISA).

Typically, the computer system 500 includes one or more user input/output devices such as a keyboard and/or mouse 513, or other means of controlling the cursor (e.g., touchscreen, touchpad, joystick, trackball, etc.) represented by the user input devices 515. The communication interfaces 511, keyboard and mouse 513 and user input devices 515 may be used in various combinations, or separately, as means for receiving information and other inputs to be used in carrying out various programs and calculations. A display 517 is also generally included as part of the computer system 500. The display may be any of several types of displays, including a liquid crystal display (LCD), a cathode ray tube (CRT) monitor, a thin film transistor (TFT) array, or other type of display suitable for displaying information for the user. The display 517 may include one or more light emitting diode (LED) indicator lights, or other such display devices. In addition, most computer systems 500 also include, or are connected to, one or more speakers and microphones 519 for audio output and input. Speech recognition software may be used in conjunction with the microphones 519 to receive and interpret user speech commands.

The invention may be implemented with any sort of processing units, processors and controllers capable of performing the stated functions and activities. For example, the processor 501 (or other processors used to implement the embodiments) may be a microprocessor, microcontroller, DSP, RISC processor, or any other type of processor that one of ordinary skill would recognize as being capable of performing the functions or activities described herein. A processing unit in accordance with at least one embodiment can operate computer software programs stored (embodied) on a computer-readable medium such as the internal memory 503, the storage drive 507, or other type of machine-readable medium, including for example, floppy disks, optical disks, a hard disk, CD, flash memory, ram, or other type of machine readable medium as recognized by those of ordinary skill in the art. The computer system 500 is configured to receive the design or other netlist information for the integrated circuit (IC) or other circuitry or to be analyzed and store the information in a computer-readable medium such as the internal memory 503, the storage drive 507, or other type of machine-readable medium. The computer system 500 is configured to modify the design by loading and executing instructions that operate on the netlist information. Upon completing modifications to the design the computer system 500 is configured to provide the modified design information, e.g., by storing it on a computer readable medium, in a format suitable for fabricating the IC design.

Computer software programs and instructions can be used to aid or perform the steps and activities described above. For example computer programs in accordance with at least one embodiment may include: source code for building a simplified netlist from an original netlist of the digital circuitry design; source code for building a composite netlist from the simplified netlist and the original netlist, the composite netlist comprising a plurality of failure targets associated with a respective plurality of implications; source code for checking each of the implications to ensure that for an associated simplified netlist target there is a corresponding original netlist target; source code for verifying the simplified netlist by determining whether each of the failure targets is assertable or is unassertable; source code for reporting as being validated any unassertable ones of the plurality of failure targets in response to the verifying the simplified netlist; source code for determining if there are any assertable failure targets, and if there are, attempting to validate them by considering a failure scenario in the simplified netlist and checking for a corresponding failure scenario in the original netlist; and source code for reporting as being validated any assertable failure targets having a failure scenario in the simplified netlist and a corresponding failure scenario in the original netlist. There are many further source codes that may be written to perform the stated steps and procedures above, and these are intended to lie within the scope of at least one or more of the various embodiments.

Various activities may be included or excluded as described above, or performed in a different order, with the rest of the activities still remaining within the scope of at least one embodiment. For example, in various implementations the selection of verification algorithms (block 117 of FIG. 1) may be performed as a preliminary step before the method begins rather than after step 111 as it is depicted in FIG. 1. Other changes in the order of activities depicted in the figures are expected to fall within the scope of at least on of the various embodiments. State holding elements, sometimes called state devices or state elements, are discussed above in terms of being implemented as registers or gates. However, in some embodiments any sort of state holding element may be used to implement various embodiments, including for example, registers, latches, state machines, or the like. For the purposes of illustrating and explaining the invention the terms variable, gate and register have been used interchangeably throughout this disclosure.

The description of the various embodiments provided above is illustrative in nature and is not intended to limit the invention, its application, or uses. Thus, variations that do not depart from the gist of the invention are intended to be within the scope of the embodiments of the present invention. Such variations are not to be regarded as a departure from the spirit and scope of the present invention.

What is claimed is:

1. A method of reducing a digital circuitry design to build a simplified circuit that preserves assertability, the method comprising:

build a simplified netlist from an original netlist of the digital circuitry design;

build a composite netlist from the simplified netlist and the original netlist, said composite netlist comprising a plurality of failure targets associated with a respective plurality of implications including an implication, said implication being associated with a failure target among the plurality of failure targets;

check each of said plurality of implications of the composite netlist to ensure that for an associated simplified netlist target there is a corresponding original netlist target, wherein an assertion of said failure target indicates a failure of the implication associated with said failure target;

verify, using a computer, the simplified netlist by determining whether each of the plurality of failure targets of the composite netlist is assertable or is unassertable;

report as being validated any unassertable ones of the plurality of failure targets in response to the verifying the simplified netlist;

determine an assertable failure target among the plurality of failure targets of the composite netlist;

validate said assertable failure target by considering a failure scenario of the failure target in the simplified netlist and confirming a corresponding failure scenario in the original netlist; and report as being validated said assertable failure target in response to confirming said failure scenario in the simplified netlist and said corresponding failure scenario in the original netlist.

2. The method of claim 1, further comprising:

identify a plurality of candidate merges between components in said original netlist;

wherein the simplified netlist merges said plurality of candidate merges.

3. The method of claim 2, further comprising:

if, in the checking of said plurality of implications, an assertable failure target that cannot be validated is discovered among the plurality of failure targets, remove the assertable failure target by eliminating one or more of said plurality of candidate merges.

4. The method of claim 3, where the simplified netlist is a first simplified netlist, and wherein the plurality of candidate merges is a first plurality of candidate merges, the method further comprising:

build a second simplified netlist without said one or more of said plurality of candidate merges.

5. The method of claim 2, further comprising:

upon failing to validate any assertable ones of the plurality of failure targets, select one or more of said plurality of candidate merges for elimination.

6. The method of claim 1, further comprising:

select one or more verification algorithms, wherein said verification algorithms are used to verify the simplified netlist.

7. The method of claim 1, further comprising:

report results of producing the simplified circuit in response to determining all of said failure targets to be unassertable.

8. The method of claim 1, wherein any assertable ones of the plurality of failure targets reported as being validated are assertable but not equivalent.

9. The method of claim 1, wherein the failure target among said plurality of failure targets proven to be unassertable for the simplified netlist is valid to imply an unassertable corresponding target on the original netlist.

10. A software product comprising a program of instructions stored on a non-transitory machine readable device for reducing a digital circuitry design to build a simplified circuit that preserves assertability, wherein the program of instructions upon being executed on a computer causes the computer to perform activities comprising:

building a simplified netlist from an original netlist of the digital circuitry design;

building a composite netlist from the simplified netlist and the original netlist, said composite netlist comprising a plurality of failure targets associated with a respective plurality of implications including an implication, said implication being associated with a failure target among the plurality of failure targets;

checking each of said plurality of implications of the composite netlist to ensure that for an associated simplified netlist target there is a corresponding original netlist target, wherein an assertion of said failure target indicates a failure of the implication associated with said failure target;

verifying the simplified netlist by determining whether each of the plurality of failure targets of the composite netlist is assertable or is unassertable;

reporting as being validated any unassertable ones of the plurality of failure targets in response to the verifying the simplified netlist;

determine an assertable failure target among the plurality of failure targets of the composite netlist validate said assertable failure target by considering a failure scenario of the failure target in the simplified netlist and confirming a corresponding failure scenario in the original netlist; and reporting as being validated said assertable failure target in response to confirming said failure scenario in the simplified netlist and said corresponding failure scenario in the original netlist.

11. The product of claim 10, further comprising:

identifying a plurality of candidate merges between components in said original netlist;

wherein the simplified netlist merges said plurality of candidate merges.

12. The product of claim 11, further comprising:

if, in the checking of said plurality of implications, an assertable failure target that cannot be validated is discovered among the plurality of failure targets, remove the assertable failure target by eliminating one or more of said plurality of candidate merges.

13. The product of claim 12, where the simplified netlist is a first simplified netlist, and wherein the plurality of candidate merges is a first plurality of candidate merges, the method further comprising:

building a second simplified netlist without said one or more of said plurality of candidate merges.

14. The product of claim 11, further comprising:

upon failing to validate any assertable ones of the plurality of failure targets, selecting one or more of said plurality of candidate merges for elimination.

15. The product of claim 10, further comprising:

select one or more verification algorithms, wherein said verification algorithms are used to verify the simplified netlist.

16. The product of claim 10, further comprising:

report results of producing the simplified circuit in response to determining all of said failure targets to be unassertable.

17. The product of claim 10, wherein any assertable ones of the plurality of failure targets reported as being validated are assertable but not equivalent.

18. The product of claim 10, wherein the failure target among said plurality of failure targets proven to be unassertable for the simplified netlist is valid to imply an unassertable corresponding target on the original netlist.

19. A computer system configured to reduce a digital circuitry design for building a simplified circuit that preserves assertability, the computer system comprising:

a first memory portion of a hard drive configured to store an original netlist of the digital circuitry design and a simplified netlist built from the original netlist;

a second memory portion of the hard drive configured to store a composite netlist built from the simplified netlist and the original netlist, said composite netlist comprising a plurality of failure targets associated with a respective plurality of implications including an implication, said implication being associated with a failure target among the plurality of failure targets;

a processor configured to execute instructions for checking each of said plurality of implications of the composite netlist to ensure that for an associated simplified netlist target there is a corresponding original netlist target, wherein an assertion of said failure target indicates a failure of the implication associated with said failure target, and wherein said instructions verify the simplified netlist by determining whether each of the plurality of failure targets of the composite netlist is assertable or is unassertable; and a computer display configured to report as being validated any unassertable ones of the plurality of failure targets in response to the verifying the simplified netlist;

wherein, said instructions are configured to validate an assertable failure target by considering a failure scenario of the failure target in the simplified netlist and confirming a corresponding failure scenario in the original netlist; and wherein the computer display is further configured to report as being validated said assertable failure targets having failure target in response to confirming said failure scenario in the simplified netlist and said corresponding failure scenario in the original netlist.

20. The computer system of claim 19, wherein any assertable ones of the plurality of failure targets reported as being validated are assertable but not equivalent.

21. The computer system of claim 19, wherein the failure target among said plurality of failure targets proven to be unassertable for the simplified netlist is valid to imply an unassertable corresponding target on the original netlist.

* * * * *